US010866523B2

(12) United States Patent
Tel et al.

(10) Patent No.: US 10,866,523 B2
(45) Date of Patent: Dec. 15, 2020

(54) PROCESS WINDOW TRACKER

(71) Applicant: ASML NETHERLANDS B.V., Veldhoven (NL)

(72) Inventors: Wim Tjibbo Tel, Helmond (NL); Frank Staals, Eindhoven (NL); Mark John Maslow, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 115 days.

(21) Appl. No.: 15/579,938

(22) PCT Filed: May 27, 2016

(86) PCT No.: PCT/EP2016/062069
§ 371 (c)(1),
(2) Date: Dec. 5, 2017

(87) PCT Pub. No.: WO2016/202559
PCT Pub. Date: Dec. 22, 2016

(65) Prior Publication Data
US 2018/0224752 A1 Aug. 9, 2018

Related U.S. Application Data

(60) Provisional application No. 62/180,523, filed on Jun. 16, 2015.

(51) Int. Cl.
*G03F 7/20* (2006.01)
*H01L 21/027* (2006.01)
(52) U.S. Cl.
CPC ...... *G03F 7/70533* (2013.01); *G03F 7/70525* (2013.01); *G03F 7/70891* (2013.01); *H01L 21/0274* (2013.01)

(58) Field of Classification Search
CPC ............ G03F 7/70525; G03F 7/70533; G03F 7/70891; H01L 21/0274
See application file for complete search history.

(56) References Cited

U.S. PATENT DOCUMENTS 7,695,876 B2 4/2010 Ye et al.
7,747,978 B2 6/2010 Ye et al.
(Continued)

FOREIGN PATENT DOCUMENTS

EP 1217448 6/2002
EP 1360554 11/2003
(Continued)

OTHER PUBLICATIONS

International Search Report and Written Opinion dated Sep. 26, 2016 in corresponding International Patent Application No. PCT/EP2016/062069.

*Primary Examiner* — Yuhui R Pan
(74) *Attorney, Agent, or Firm* — Pillsbury Winthrop Shaw Pittman LLP

(57) ABSTRACT

A method for adjusting a lithography process, wherein processing parameters of the lithography process include a first group of processing parameters and a second group of processing parameters, the method including: obtaining a change of the second group of processing parameters; determining a change of a sub-process window (sub-PW) as a result of the change of the second group of processing parameters, wherein the sub-PW is spanned by only the first group of processing parameters; and adjusting the first group of processing parameters based on the change of the sub-PW.

21 Claims, 7 Drawing Sheets

(56) References Cited

U.S. PATENT DOCUMENTS

| | | | |
|---|---|---|---|
| 8,856,694 B2 | 10/2014 | Ye et al. | |
| 9,360,766 B2 | 6/2016 | Ye et al. | |
| 2002/0100013 A1* | 7/2002 | Miwa | G03F 7/705 700/121 |
| 2005/0076322 A1* | 4/2005 | Ye | G06F 30/398 716/52 |
| 2006/0206851 A1 | 9/2006 | Van Wingerden et al. | |
| 2007/0031745 A1 | 2/2007 | Ye et al. | |
| 2007/0050749 A1 | 3/2007 | Ye et al. | |
| 2007/0177123 A1* | 8/2007 | Tel | G03B 27/42 355/69 |
| 2008/0072207 A1* | 3/2008 | Verma | G03F 1/84 716/52 |
| 2008/0094598 A1* | 4/2008 | Rosenbluth | G03F 7/70125 355/69 |
| 2009/0296055 A1* | 12/2009 | Ye | G03F 7/705 355/30 |
| 2010/0162197 A1 | 6/2010 | Ye et al. | |
| 2012/0303151 A1* | 11/2012 | Ye | G05B 13/04 700/119 |

FOREIGN PATENT DOCUMENTS

| | | |
|---|---|---|
| WO | 2015/139951 | 9/2015 |
| WO | 2016/012316 | 1/2016 |

\* cited by examiner

PROCESS WINDOW TRACKER

CROSS-REFERENCE TO RELATED APPLICATIONS

This application is the U.S. national phase entry of PCT patent application no. PCT/EP2016/062069, which was filed on May 27, 2016, which claims the benefit of priority of U.S. patent application No. 62/180,523, which was filed on Jun. 16, 2015, and each of which is incorporated herein in its entirety by reference.

FIELD

The present disclosure relates to a method of improving the performance of a manufacturing process. The method may be used in connection with a lithographic apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

SUMMARY

Disclosed herein is a computer-implemented method of adjusting a lithography process, wherein processing parameters of the lithography process comprise a first group of processing parameters and a second group of one or more processing parameters, the method comprising: obtaining a change of the second group of one or more processing parameters; determining a change of a sub-PW as a result of the change of the second group of one or more processing parameters, wherein the sub-PW is spanned by only the first group of processing parameters; and adjusting the first group of processing parameters based on the change of the sub-PW.

According to an embodiment, the first group of processing parameters comprises focus and dose.

According to an embodiment, the first group of processing parameters consists of processing parameters adjustable in the lithography process.

According to an embodiment, the first group of processing parameters consists of all processing parameters adjustable in the lithography process.

According to an embodiment, the second group of one or more processing parameters comprises a characteristic of deformation of projection optics of a lithography apparatus used in the lithography process.

According to an embodiment, the deformation is caused by a temperature change of the projection optics of the lithography apparatus.

According to an embodiment, the temperature change is a result of exposure to radiation from a source of the lithography apparatus.

According to an embodiment, the second group of one or more processing parameters comprises a characteristic of a temporal variation of a parameter of the lithography process.

According to an embodiment, the parameter of the lithography process comprises laser bandwidth, laser wavelength or stage movement.

According to an embodiment, the second group of one or more processing parameters comprises a characteristic of post-exposure bake, development, etching, doping, deposition or packaging.

According to an embodiment, adjusting the first group of processing parameters moves a point, to which adjusted values of the first group of processing parameters correspond, farther away from a boundary of the sub-PW.

According to an embodiment, adjusting the first group of processing parameters moves a point, to which adjusted values of the first group of processing parameters correspond, to at or near a center of the sub-PW.

Disclosed herein is a computer-implemented method to enlarge a sub-PW during a lithography process, wherein processing parameters of the lithography process comprises a first group of processing parameters and a second group of one or more processing parameters, the sub-PW spanned by only the first group of processing parameters and a full PW spanned by the processing parameters of the first and second groups, the method comprising: determining the full PW; determining the sub-PW from the full PW; and enlarging the sub-PW by adjusting the second group of one or more processing parameters.

According to an embodiment, the first group of processing parameters comprises focus and dose.

According to an embodiment, the first group of processing parameters consists of processing parameters adjustable in the lithography process.

According to an embodiment, the first group of processing parameters consists of all processing parameters adjustable in the lithography process.

According to an embodiment, the second group of one or more processing parameters comprises a characteristic of deformation of projection optics of a lithography apparatus used in the lithography process.

According to an embodiment, the deformation is caused by a temperature change of the projection optics of the lithography apparatus.

According to an embodiment, the temperature change is a result of exposure to radiation from a source of the lithography apparatus.

According to an embodiment, adjusting the second group of one or more processing parameters comprises using an optimization method using a cost function penalized by a size of the sub-PW, wherein the cost function is a function of the second group of one or more processing parameters.

Disclosed herein is a computer program product comprising a computer readable medium having instructions recorded thereon, the instructions when executed by a computer implementing any of the methods herein.

DETAILED DESCRIPTION

Figure 1:
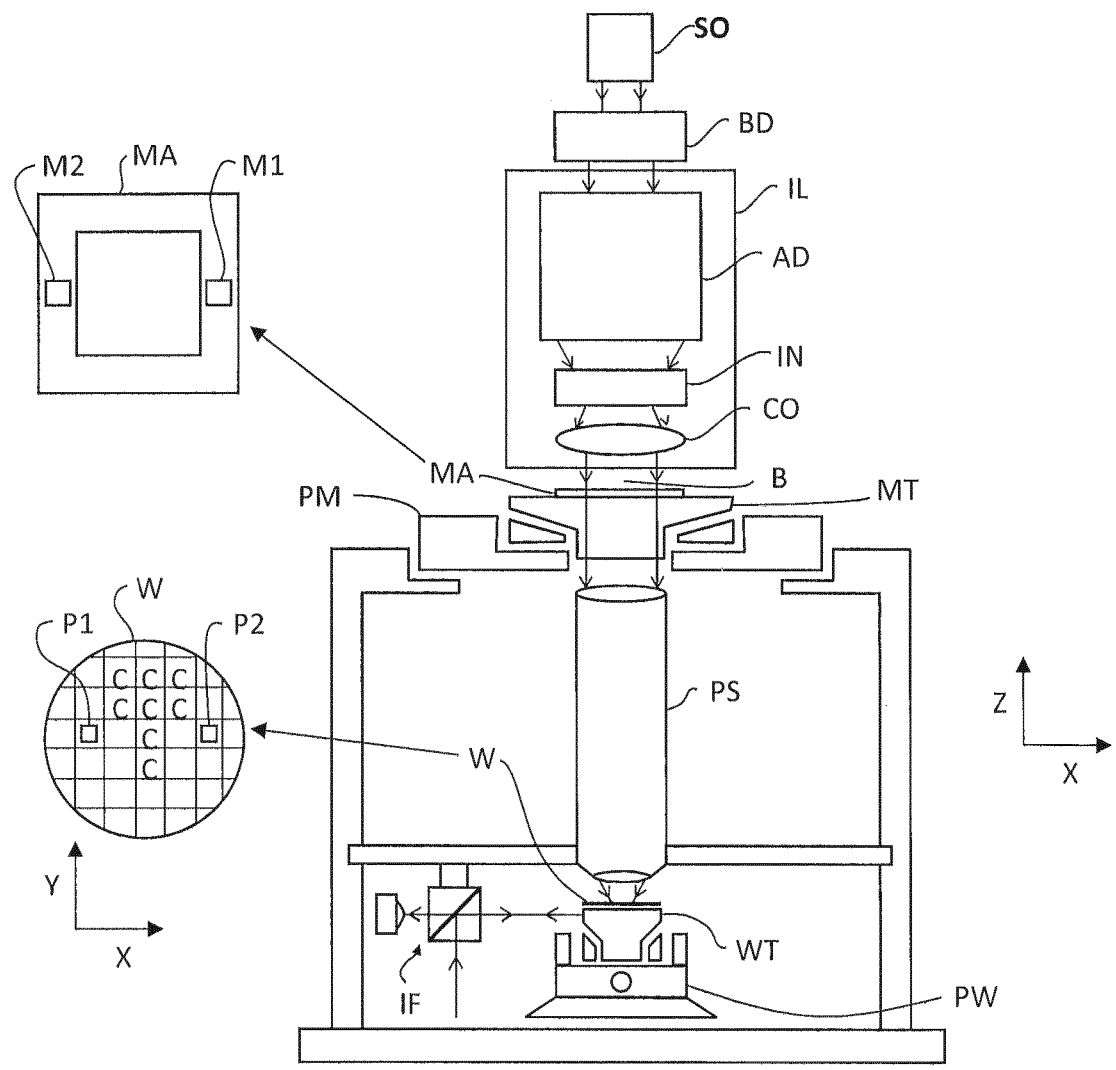
FIG. 1 schematically depicts a lithography apparatus according to an embodiment.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens."

FIG. 1 schematically depicts a lithography apparatus according to an embodiment. The apparatus comprises:

an illumination system (illuminator) IL to condition a beam B of radiation (e.g. UV radiation, deep ultraviolet (DUV) radiation or extreme ultraviolet (EUV) radiation).

a support structure MT to support a patterning device (e.g. a mask) MA and connected to first positioning device PM to accurately position the patterning device with respect to item PS;

a substrate table (e.g. a wafer table) WT to hold a substrate (e.g. a resist coated wafer) W and connected to second positioning device PW to accurately position the substrate with respect to item PS; and a projection system (e.g. a refractive projection lens) PS configured to image a pattern imparted to the radiation beam B by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above or a reflective mask).

The illuminator IL receives a beam of radiation from a radiation source SO. The source and the lithography apparatus may be separate entities, for example when the source is an excimer laser. In such cases, the source is not considered to form part of the lithography apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. In an embodiment, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation B, having a desired uniformity and intensity distribution in its cross section.

The radiation beam B is incident on the patterning device (e.g. mask) MA, which is held on the support structure MT. Having traversed the patterning device MA, the beam B traverses the projection system PS, which focuses the beam onto a target portion C of the substrate W. With the aid of the second positioning device PW and position sensor IF (e.g. an interferometric device), the substrate table WT can be moved accurately, e.g. so as to position different target portions C in the path of the beam B. Similarly, the first positioning device PM and another position sensor (which is not explicitly depicted in FIG. 1) can be used to accurately position the patterning device MA with respect to the path of the beam B, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a lithography apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used. The projection system PS may comprise a plurality of optical (e.g., lens) elements and may further comprise an adjustment mechanism configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed, e.g., by using one or more actuators to exert force on one or more sides of the optical element and/or by using one or more heat transfer elements (e.g., electric heater, a laser beam, etc.) to change the temperature of one or more selected regions of the optical element. In general, it may not be possible to adjust the projection system PS to correct for apodizations (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodizations.

Figure 2:
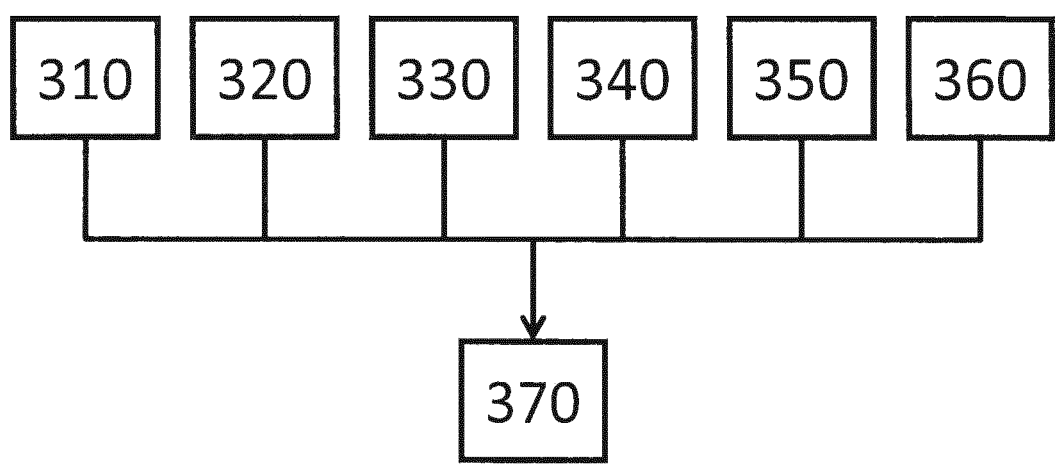
FIG. 2 shows example sources of the processing parameters.

Parameters of the lithography process may be called "processing parameters." The lithography process may include processes upstream and downstream to the actual exposure. FIG. 2 shows example categories of the processing parameters 370. The first category may be one or more parameters 310 of the lithography apparatus or any other apparatuses used in the lithography process. Examples of this category include one or more parameters of the source, projection optics, substrate stage, etc. of a lithography apparatus. The second category may be one or more parameters 320 of any one or more procedures performed in the lithography process. Examples of this category include exposure duration, development temperature, a chemical composition used in development, etc. The third category may be one or more parameters 330 of the design layout. Examples of this category may include a shape and/or location of one or more assist features, one or more adjustments applied by a resolution enhancement technique (RET), etc. The fourth category may be one or more parameters 340 of the substrate. Examples of this category include one or more characteristics of a structure under a resist layer, a chemical composition of a resist layer, a physical dimension of a resist layer, etc. The fifth category may be one or more characteristics 350 of a temporal variation of one or more parameters of the lithography process. Examples of this category may include a character of high frequency stage movement (e.g., frequency, amplitude, moving standard deviation (MSD), etc.), a high frequency laser bandwidth change (e.g., frequency, amplitude, etc.), a high frequency laser wavelength change, etc. These high frequency changes or movements are those above the response time of a mechanism to adjust to the one or more underlying parameters (e.g., stage position, laser intensity, etc.). They may cause, for example, contrast loss and/or image blur. As an example, a correction may be limited by the exposure slit size. So, if within the time a point on the substrate is within the slit and it moves in x, y or z, this cannot be readily corrected. But, lower frequency variation of movement can by, for example, movement of the stage in x, y or z. Thus, a high frequency variation may effectively cause an image blur in resist, thereby reducing contrast. The sixth category may be one or more characteristics 360 downstream to exposure, such as post-exposure bake (PEB), development, etching, deposition, doping, packaging, etc.

The values of some or all of the processing parameters may be determined by a suitable method. For example, the values of one or more of the processing parameters may be determined from data obtained with one or more various metrology tools (e.g., a substrate metrology tool). Additionally or alternatively, the values of one or more of the processing parameters may be obtained from one or more various sensors in the lithography apparatus. Additionally or alternatively, the values of one or more of the processing parameters may be from an operator of the lithography process.

Various patterns or pattern features on or of a patterning device may have different process windows, i.e., a process window being a domain (e.g., a space) of values of processing parameters under which a pattern will be produced within specification. Examples of pattern specifications that relate to a potential systematic defect include a check for necking, line pull back, line thinning, CD, edge placement, overlapping, resist top loss, resist undercut and/or bridging. The process window of all the patterns or pattern features on or of a patterning device (or an area thereof) may be obtained by merging (e.g., overlapping) process windows of each individual pattern or pattern feature. The boundary of the process window of all the patterns and/or pattern features contains boundaries of process windows of some of the individual pattern and/or pattern features. In other words, these individual patterns or pattern features limit the process window of all the patterns or pattern features. These patterns or pattern features can be referred to as "hot spots" or "process window limiting patterns (PWLPs)," which are used interchangeably herein. When controlling a lithography process, it is possible and/or economical to focus on the hot spots. When the hot spots are not defective, it is most likely that the all the patterns and/or pattern features are not defective.

From a mathematical point of view, a process window is a region in a vector space spanned by all the processing parameters. In a given lithography process, the process window of a pattern is dictated only by the specifications of the pattern and the physics involved in the lithography process. Namely, if the specifications and the physics do not change during the lithography process, the process window does not change.

However, one or more of the processing parameters may not be measurable in a particular lithography process, for example, when the lithography apparatus is not equipped with a sensor that can measure one or more of the processing parameters; and/or one or more of the processing parameters may not be adjustable in a particular lithography process, for example, due to software or hardware limitations. Therefore, using a region in a vector space spanned by all the processing parameters as the process window may not be convenient. A region of a subspace (i.e., a space spanned by fewer than all the processing parameters) of the process window ("sub-PW") may be used instead of the region of the space spanned by all the processing parameters ("full PW"). For example, in a lithography process with many processing parameters, a region of the subspace spanning focus and dose may be used as a sub-PW. The processing parameters spanning the subspace may be all measurable and adjustable. Not all processing parameters that are measurable and adjustable have to be used to span the subspace. In a lithography apparatus, the focus and dose are usually adjustable and measurable while other processing parameters such as a characteristic of the deformation of the projection optics (e.g., induced by temperature change of components of the lithography apparatus) may be unmeasurable (i.e., whose value cannot readily be ascertained or estimated), unadjustable, or both.

Using the sub-PW may be more convenient but the sub-PW may not remain unchanged during the lithography process. This is because those processing parameters not spanning the sub-PW may vary or change during the lithography process. For example, one or more processing parameters may vary with position on a substrate and/or with time (e.g., between substrates, between dies). Such variation may be caused by change in the environment such as temperature and/or humidity, intentional adjustment, electrical or mechanical noise, etc. Other causes of variation in one or more processing parameters may include deformation or drift in one or more components in the lithography apparatus, such as the source, projection optics, substrate table, a height variation of a substrate surface, slit position variation, etc. in a lithography apparatus. Other variation of one or more processing parameters may include a drift in a postexposure process (e.g., PEB time, PEB temperature, PEB temperature profile, chemical composition of developer, duration and/or temperature of development, gas composition and/or pressure used in etch, power, temperature and/or duration of etch, etc.).

Figure 3:
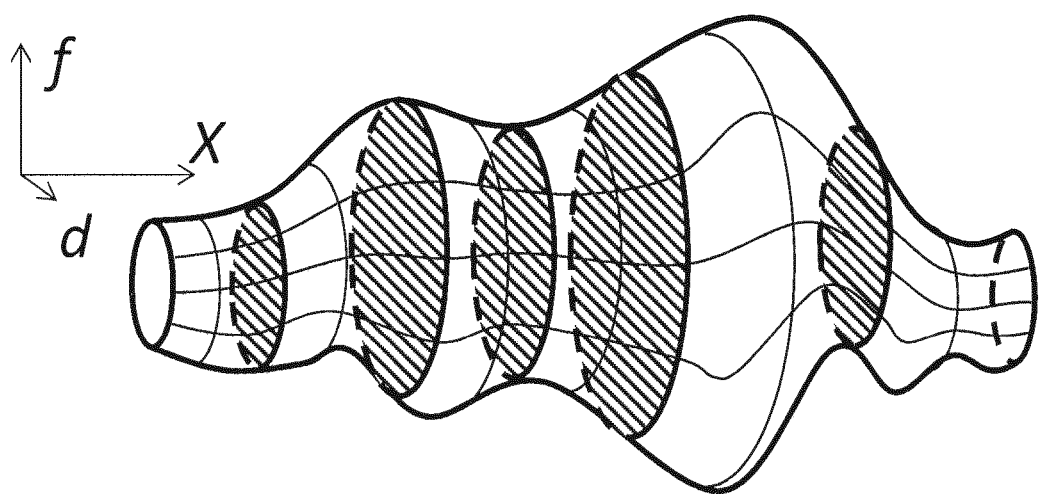
FIG. 3 shows example categories of the processing parameters.

FIG. 3 schematically shows an example of why a sub-PW may not remain unchanged during the lithography process. For convenience, the PW is depicted as a region of a three-dimensional (e.g., focus (f), dose (d) and another processing parameter X) space although the PW may actually have many more dimensions. Sub-PWs spanned by two of the processing parameters—focus (f) and dose (d)—are shown as cross-sections of the PW. As the processing parameter X changes during the lithography process for any reason, the sub-PW spanned by f and d—the ranges of f and d under which a pattern will be produced within specification under the condition of the value of X—may not remain unchanged. This is because the underlying condition of X changes. In order to maintain robustness of the lithography process, the processing parameters spanning the sub-PW (f and d in this example) may be tuned such that their values correspond to a point in the sub-PW away from the boundary of the sub-PW. The dose may be the "effective dose," which relates to the radiation intensity, exposure duration, and PEB.

Figure 4A:
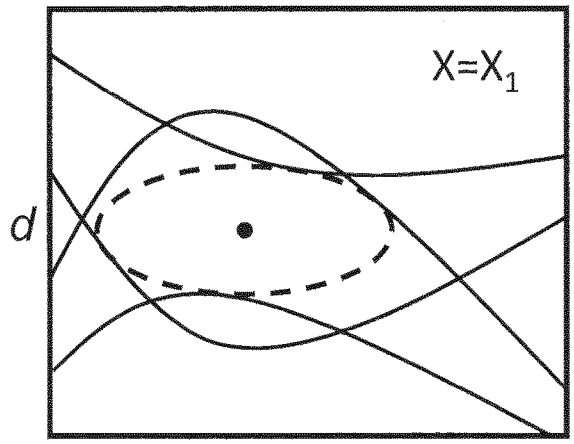
FIG. 4A and FIG. 4B each show an example of sub-PWs under two different conditions.
Figure 4B:
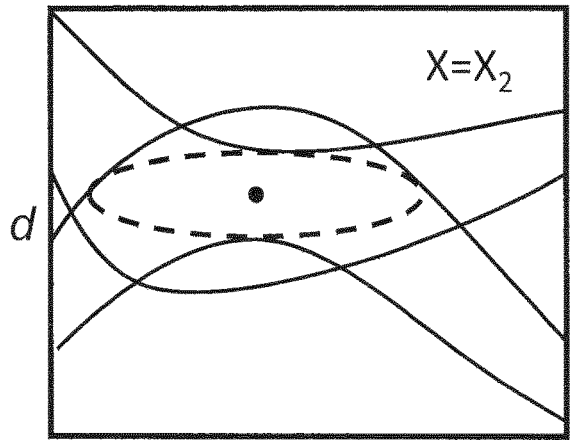
Figure 4C:
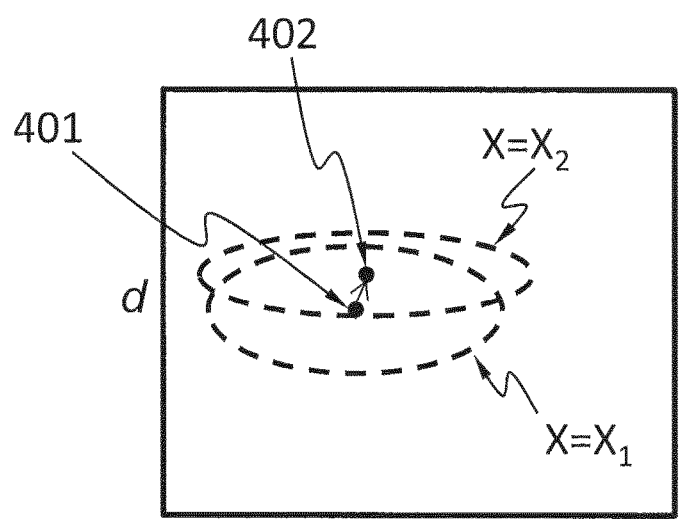
FIG. 4C shows the difference between these sub-PWs in FIG. 4a and FIG. 4B.

FIG. 4A shows an example of the sub-PW spanned by d and f under the condition that the value of X is $X_1$. FIG. 4B shows an example of the sub-PW spanned by d and f under the condition that the value of X is $X_2$. FIG. 4C shows the difference between these sub-PWs. It can be seen that the centers 401 and 402 of the sub-PWs are not identical. Accordingly, it would be beneficial if f and d can be tuned as X changes from $X_1$ to $X_2$ such that the values of d and f correspond to the centers 401 and 402, respectively.

Figure 5:
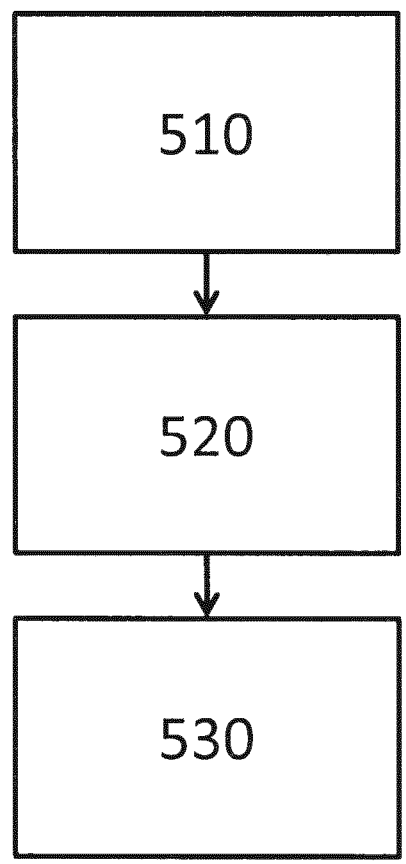
FIG. 5 shows a flow chart of a method of "tracking" the sub-PW during a lithography process.

FIG. 5 shows a flow chart of a method of "tracking" the sub-PW during a lithography process. The full PW is spanned by a first group of processing parameters and a second group of one or more processing parameters (e.g., a plurality of processing parameters) and the sub-PW is spanned by only the first group. At 510, a change of the second group of one or more processing parameters is obtained (e.g., by measurement or simulation). At 520, the change of the sub-PW as a result of the change of the second group of one or more processing parameters is determined. At 530, the first group of processing parameters is adjusted based on the change of the sub-PW. The first group may include focus and dose. The first group may include only processing parameters adjustable in the lithography process. The first group may include all processing parameters adjustable in the lithography process. The second group may include one or more characteristics of deformation of the projection optics of the lithography apparatus used in the lithography process. The deformation may be caused by a temperature change of the projection optics or by another component (e.g., the source, the patterning device, etc.) of the lithography apparatus. The temperature change may be a result of exposure to radiation from the source of the lithography apparatus. The second group may include a characteristic of a temporal variation of a parameter of the lithography process, such as laser bandwidth, laser wavelength and/or stage movement. The second group may include a characteristic of PEB, development, etching, doping, deposition and/or packaging. Adjusting the first group of processing parameters may be such that the point to which the adjusted values of the first group of processing parameters correspond is moved farther away from the boundary of the sub-PW. Adjusting the first group of processing parameters may be such that the adjusted values of the first group of processing parameters correspond to the center (a point farthest from the boundary) of the sub-PW or a location close to the center (e.g., a distance from the center within or equal to 1%, 2%, 5%, 10%, 15%, 20%, 25% or 30% of the distance from the center to the boundary). Here the full PW and the sub-PW may be a process window of one pattern or pattern feature or an overlapping process window of a plurality of patterns or pattern features on a design layout, not necessarily all patterns or pattern features on the design layout.

Figure 6:
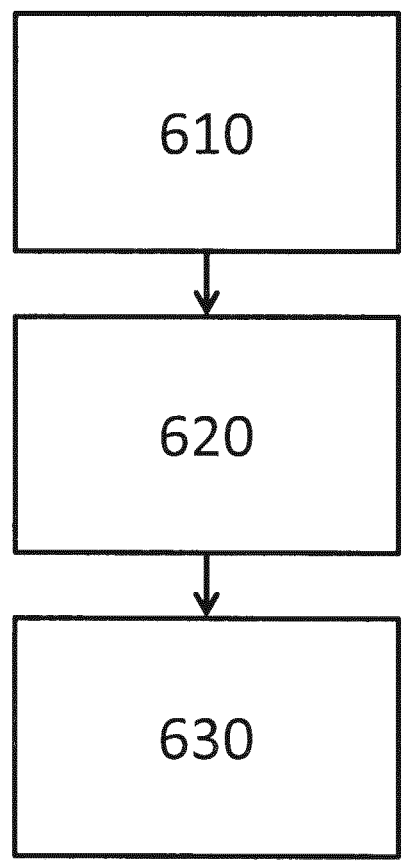
FIG. 6 shows a flow chart of a method of enlarging a sub-PW during a lithography process.

FIG. 6 shows a flow chart for a method of enlarging a sub-PW of (e.g., during) a lithography process. The full PW is spanned by a first group of processing parameters and a second group of one or more processing parameters and the sub-PW is spanned by only the first group. At 610, the full PW is determined. At 620, the sub-PW is determined from the full PW. At 630, the sub-PW is enlarged by adjusting the second group of one or more processing parameters. The first group may include focus and dose. The first group may include only processing parameters adjustable in the lithography process. The first group may include all processing parameters adjustable in the lithography process. The second group may include a characteristic of deformation of the projection optics of the lithography apparatus used in the lithography process. The deformation may be caused by a temperature change of the projection optics or by one or more other components of the lithography apparatus. The temperature change may be a result of exposure to radiation from the source of the lithography apparatus. Adjusting the second group of one or more processing parameters may be by an optimization method using a cost function penalized by the size of the sub-PW and that is a function of the second group of one or more processing parameters. Here the full PW and the sub-PW may be a process window of one pattern or pattern feature or an overlapping process window of a plurality of patterns or pattern features on a design layout, not necessarily all patterns or pattern features on the design layout. Using the example in FIG. 3 to demonstrate this method of FIG. 6, the processing parameter X can be adjusted to a value that makes the cross-sectional area (i.e., the size of the sub-PW spanned by f and d) the largest (or greater than or equal to 99%, 98%, 95%, 90%, 85%, 80%, 75% or 70% of the largest).

Thus, in an embodiment, differences in, e.g., high frequency variation of stage movement (e.g., MSD) and/or of laser bandwidth may be corrected by focus and dose, such that the process remains at or near the center of the applicable process window. Or, for example, laser bandwidth may be adjusted (e.g., decreased) to correct for a contrast effect (e.g., contrast loss) or a stage movement (e.g., rotation about x or y in the exposure slit) to compensate for contrast. Further, in an embodiment, one contrast term can be used to correct for another (e.g. MSD correction by laser BW) to retain the size of the overlapping process window. I assume that this patent also covers the case where I want to use.

In an embodiment, given predicted or measured aberrations over the exposure of lot of substrate, the overlapping process window of one or more features of interest (can be done full chip or limited to process window limiting features) can be calculated. The overlapping process window will drift as discussed in respect of FIGS. 3 and 4. Additionally or alternatively determining the process window variation over a lot, the process window variation over the exposure slit may be calculated (e.g., aberrations may vary across the exposure slit).

As noted above, a particular use of the methods herein may be for the example of heating of optical elements in the exposure beam path due to, e.g., the beam itself and/or other components. But, the techniques herein can be used to counteract other variations, such as optical aberration from another source, degree of polarization, high frequency stage movement variation, etc. Further, the evaluation of the full PW and sub-PW in the methods herein may be used to identify tool to tool differences, e.g., different movements of the center of a sub-PW for different tools executing the same or similar process may signal an issue with a tool that may require correction. Similarly, the evaluation of the full PW and sub-PW in the methods herein may be used to identify degradation or a need for re-setup of an optical element in the exposure beam path, e.g., the center of a sub-PW may move over time for different lots and so may signal an issue with an optical element that may require correction (e.g., replacement, cleaning, re-setup, etc.).

Figure 7:
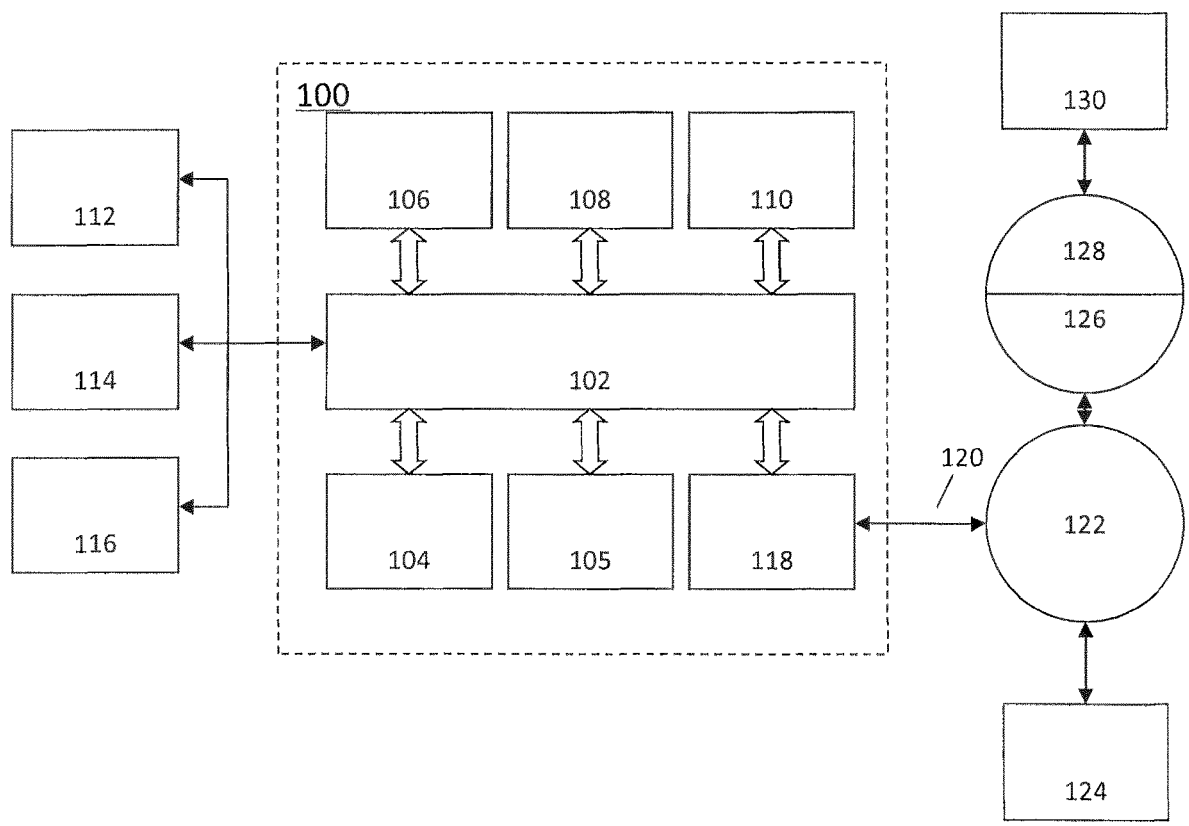
FIG. 7 is a block diagram of an example computer system.

FIG. 7 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for a method of an embodiment described herein, for example. The received code may be executed by processor 104 as it is received, and/or stored in storage device 110, or other non-volatile storage for later execution. In this manner, computer system 100 may obtain application code in the form of a carrier wave.

The invention may further be described using the following clauses:

1. A computer-implemented method of adjusting a lithography process, wherein processing parameters of the lithography process comprise a first group of processing parameters and a second group of one or more processing parameters, the method comprising:
   obtaining a change of the second group of one or more processing parameters;
   determining a change of a sub-PW as a result of the change of the second group of one or more processing parameters, wherein the sub-PW is spanned by only the first group of processing parameters; and
   adjusting the first group of processing parameters based on the change of the sub-PW.
2. The method of clause 1, wherein the first group of processing parameters comprises focus and dose.
3. The method of clause 1 or clause 2, wherein the first group of processing parameters consists of processing parameters adjustable in the lithography process.
4. The method of any of clauses 1 to 3, wherein the first group of processing parameters consists of all processing parameters adjustable in the lithography process.
5. The method of any of clauses 1 to 4, wherein the second group of one or more processing parameters comprises a characteristic of deformation of projection optics of a lithography apparatus used in the lithography process.
6. The method of clause 5, wherein the deformation is caused by a temperature change of the projection optics of the lithography apparatus.
7. The method of clause 6, wherein the temperature change is a result of exposure to radiation from a source of the lithography apparatus.
8. The method of any of clauses 1 to 7, wherein the second group of one or more processing parameters comprises a characteristic of a temporal variation of a parameter of the lithography process.
9. The method of clause 8, wherein the parameter of the lithography process comprises laser bandwidth, laser wavelength or stage movement.
10. The method of any of clauses 1 to 9, wherein the second group of one or more processing parameters comprises a characteristic of post-exposure bake, development, etching, doping, deposition or packaging.

11. The method of any of clauses 1 to 10, wherein adjusting the first group of processing parameters moves a point, to which adjusted values of the first group of processing parameters correspond, farther away from a boundary of the sub-PW.

12. The method of any of clauses 1 to 10, wherein adjusting the first group of processing parameters moves a point, to which adjusted values of the first group of processing parameters correspond, to at or near a center of the sub-PW.

13. A computer-implemented method to enlarge a sub-PW during a lithography process, wherein processing parameters of the lithography process comprises a first group of processing parameters and a second group of one or more processing parameters, the sub-PW spanned by only the first group of processing parameters and a full PW spanned by the processing parameters of the first and second groups, the method comprising:

determining the full PW;

determining the sub-PW from the full PW; and enlarging the sub-PW by adjusting the second group of one or more processing parameters.

14. The method of clause 13, wherein the first group of processing parameters comprises focus and dose.

15. The method of clause 13 or clause 14, wherein the first group of processing parameters consists of processing parameters adjustable in the lithography process.

16. The method of any of clauses 13 to 15, wherein the first group of processing parameters consists of all processing parameters adjustable in the lithography process.

17. The method of any of clauses 13 to 16, wherein the second group of one or more processing parameters comprises a characteristic of deformation of projection optics of a lithography apparatus used in the lithography process.

18. The method of clause 17, wherein the deformation is caused by a temperature change of the projection optics of the lithography apparatus.

19. The method of clause 18, wherein the temperature change is a result of exposure to radiation from a source of the lithography apparatus.

20. The method of any of clauses 13 to 19, wherein adjusting the second group of one or more processing parameters comprises using an optimization method using a cost function penalized by a size of the sub-PW, wherein the cost function is a function of the second group of one or more processing parameters.

21. A computer program product comprising a computer readable medium having instructions recorded thereon, the instructions when executed by a computer implementing the method of any of clauses 1 to 20.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the disclosure have been described above, it will be appreciated that the embodiments may be practiced otherwise than as described.

The invention claimed is:

1. A method of adjusting a lithography process involving a particular exposure device, wherein processing parameters of the lithography process comprise a first group of processing parameters and a second group of one or more processing parameters different from the first group of processing parameters, the method comprising:

obtaining a measured or simulated change of the second group of one or more processing parameters;

determining, by a hardware computer system, a change of a sub-process window (sub-PW) as a result of the change of the second group of one or more processing parameters, wherein the sub-PW is spanned by only the first group of processing parameters; and adjusting, based on the change of the sub-PW, one or more values of the first group of processing parameters associated with the sub-PW as those values existed prior to the change of the sub-PW to one or more adjusted values of the first group of processing parameters associated with the change of the sub-PW.

2. The method of claim 1, wherein the first group of processing parameters comprises focus and dose.

3. The method of claim 1, wherein the first group of processing parameters consists of processing parameters adjustable in the lithography process.

4. The method of claim 1, wherein the second group of one or more processing parameters comprises a characteristic of deformation of projection optics of a lithography apparatus used in the lithography process.

5. The method of claim 4, wherein the deformation is caused by a temperature change of the projection optics of the lithography apparatus.

6. The method of claim 1, wherein the second group of one or more processing parameters comprises a characteristic of a temporal variation of a parameter of the lithography process.

7. The method of claim 6, wherein the parameter of the lithography process comprises laser bandwidth, laser wavelength or stage movement.

8. The method of claim 1, wherein the second group of one or more processing parameters comprises a characteristic of post-exposure bake, development, etching, doping, deposition or packaging.

9. The method of claim 1, wherein the adjusting moves a point, to which the adjusted values of the first group of processing parameters correspond, farther away from a boundary of the sub-PW, and/or wherein the adjusting moves a point, to which the adjusted values of the first group of processing parameters correspond, to at or near a center of the sub-PW.

10. A method to enlarge a sub-process window (sub-PW) during a lithography process, wherein processing parameters of the lithography process comprises a first group of processing parameters and a second group of one or more processing parameters different from the first group of processing parameters, the sub-PW spanned by only the first group of processing parameters and a full process window (full PW) spanned by the processing parameters of the first and second groups, the method comprising:
- determining the full PW;
- determining, by a hardware computer system, the sub-PW from the full PW; and
- enlarging the sub-PW by adjusting the second group of one or more processing parameters.

11. The method of claim 10, wherein the first group of processing parameters comprises focus and dose.

12. The method of claim 10, wherein the first group of processing parameters consists of processing parameters adjustable in the lithography process.

13. The method of claim 10, wherein the second group of one or more processing parameters comprises a characteristic of deformation of projection optics of a lithography apparatus used in the lithography process.

14. The method of claim 10, wherein adjusting the second group of one or more processing parameters comprises using an optimization method using a cost function penalized by a size of the sub-PW, wherein the cost function is a function of the second group of one or more processing parameters.

15. A computer program product comprising a non-transitory computer readable medium having instructions therein, the instructions, upon execution by a computer system, configured to cause the computer system to at least:
- obtain a measured or simulated change of a first group of one or more processing parameters of a lithography process involving a particular exposure device;
- determine a change of a sub-process window (sub-PW) as a result of the change of the first group of one or more processing parameters, wherein the sub-PW is spanned by only a second group of processing parameters of the lithography process different from the first group of one or more processing parameters; and
- adjust, based on the change of the sub-PW, one or more values of the second group of processing parameters associated with the sub-PW as those values existed prior to the change of the sub-PW to one or more adjusted values of the second group of processing parameters associated with the change of the sub-PW.

16. The computer program product of claim 15, wherein the second group of processing parameters comprises focus and dose.

17. The computer program product of claim 15, wherein the second group of processing parameters consists of processing parameters adjustable in the lithography process.

18. The computer program product of claim 15, wherein the first group of one or more processing parameters comprises a characteristic of deformation of projection optics of a lithography apparatus used in the lithography process.

19. The computer program product of claim 15, wherein the first group of one or more processing parameters comprises a characteristic of a temporal variation of a parameter of the lithography process.

20. The computer program product of claim 19, wherein the parameter of the lithography process comprises laser bandwidth, laser wavelength or stage movement.

21. A computer program product comprising a non-transitory computer readable medium having instructions therein, the instructions, upon execution by a computer system, configured to cause the computer system to at least:
- determine a full process window (full PW) of a lithography process, the full PW spanned by a first group of processing parameters of the lithography process and a second group of one or more processing parameters of the lithography process different from the first group of processing parameters;
- determine a sub-process window (sub-PW) spanned by only the first group of processing parameters, from the full PW; and
- enlarge the sub-PW by adjusting the second group of one or more processing parameters.

* * * * *